United States Patent [19]

Ikeda et al.

[11] Patent Number: 5,233,224

[45] Date of Patent: Aug. 3, 1993

[54] ELECTRODE HAVING AN IMPROVED CONFIGURATION FOR A SEMICONDUCTOR ELEMENT

[75] Inventors: Osamu Ikeda, Tokyo; Yoshio Nakamura, Atsugi, both of Japan

[73] Assignee: Canon Kabushiki Kaisha, Tokyo, Japan

[21] Appl. No.: 699,596

[22] Filed: May 14, 1991

[30] Foreign Application Priority Data

May 31, 1990 [JP] Japan ................... 2-143732

[51] Int. Cl.$^5$ .......................................... H01L 23/54
[52] U.S. Cl. .................... 257/773; 257/775; 257/774
[58] Field of Search ............... 357/68, 71, 65; 257/773, 775, 774

[56] References Cited

U.S. PATENT DOCUMENTS

| | | | |
|---|---|---|---|
| 4,244,002 | 1/1981 | Sato et al. | 357/68 |
| 4,438,450 | 3/1984 | Sheng et al. | 357/68 |
| 4,673,960 | 6/1987 | Chao et al. | 357/68 |
| 4,920,070 | 4/1990 | Mukai | 437/173 |
| 5,072,288 | 12/1991 | MacDonald et al. | 357/65 |

FOREIGN PATENT DOCUMENTS 0283311  9/1988  European Pat. Off. .

OTHER PUBLICATIONS

Thin Solid Films, vol. 45, 1977, pp. 257–263, Pierson, "Aluminum Coatings by the Decomposition of Alkyls".

*Primary Examiner*—William Mintel
*Assistant Examiner*—S. V. Clark
*Attorney, Agent, or Firm*—Fitzpatrick, Cella, Harper & Scinto

[57] ABSTRACT

An electrode for semiconductor element to be directly connected to the semiconductor region of a semiconductor element is substantially shaped in a square column. When the length of one side of the surface in contact with the semiconductor region in said electrode is defined as L, the length of the other side as W, and the length in the direction crossed substantially vertically to said surface as H, the L, W, H satisfy the relationship of $L > H > W$.

6 Claims, 12 Drawing Sheets

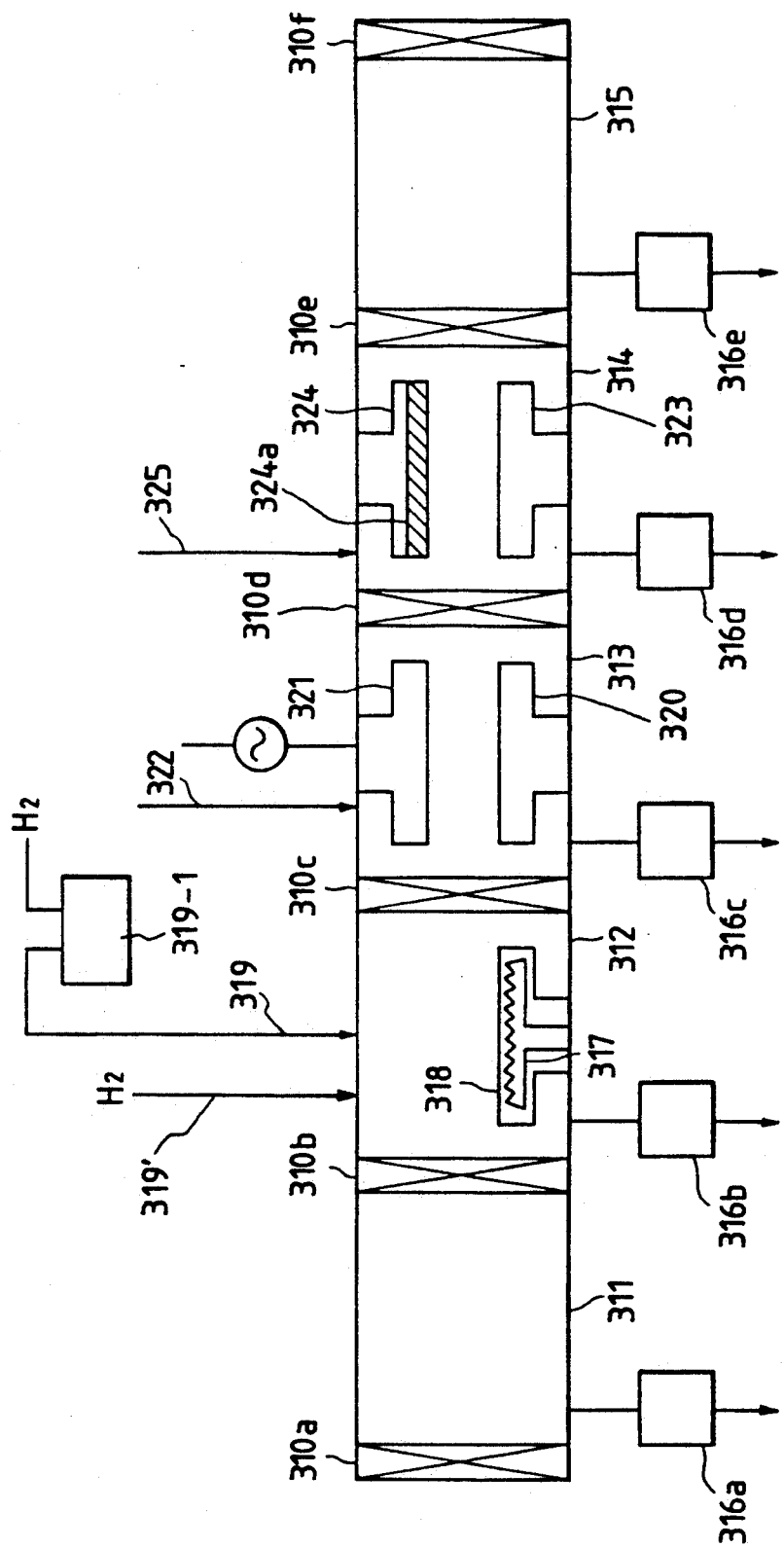

(PROCESS FLOW)

ELECTRODE HAVING AN IMPROVED CONFIGURATION FOR A SEMICONDUCTOR ELEMENT

BACKGROUND OF THE INVENTION

1. Field of the Invention

This invention relates to a semiconductor integrated circuit such as a memory, photoelectric converting device or signal processing device to be mounted on various electronic instruments, and particularly to its electrode structure.

2. Related Background Art

In recent years, there has been an interest in making a semiconductor circuit device highly integrated, for example to provide a practical application of a semiconductor functional element finely worked such as the development of an MOS transistor with a gate length of submicron order. More specifically, in the case of an MOS transistor with a gate length of 0.8 μm, the area occupied by the element is about 20 μm$^2$, having a structure suitable for higher integration.

However, even if the semiconductor functional element may be made finer effecting higher integration, it has been difficult to obtain good characteristics as expected while maintaining high yield. This point has been considered in the prior art to be a problem concerning semiconductor functional element, formation, and necessarily importance has been placed on improvement in the process for formation of semiconductor functional element. That is, it has been strongly recognized that determining how to form the element capable of good actuation stably and with good reproducibility should be the way of improving the yield.

However, as the result of detailed studies of the element structure or element formation process by the present inventors, it has been found that the yield can be greatly improved, and the performance also improved, by constituting the electrode structure.

FIGS. 11A, 11B and 11C are schematic views for illustration of the structure of MOSFET of the prior art example as described above, which correspond respectively the perspective view, the top view and the sectional view.

In the n type semiconductor substrate 1, P type wells are formed, and n+ type source-drain regions 3, 4 are formed at intervals therein. On this semiconductor substrate, an insulation film 8 is formed, and at the portions corresponding to source-drain, contact holes CH are respectively formed by etching. Also, between the source and drain, a gate electrode 5 is arranged.

Within the contact hole CH and on a part of the insulation film 8, Al, which becomes the source-drain electrode and the source-drain electrode wiring is formed as shown by deposition patterning.

The structure of the Al electrode within the contact hole will now be described.

The contact hole CH has a rectangular opening with a shorter width w and a longer length 1 according to the design of the mask for etching, and its depth h corresponds to the thickness of the insulation film on the source-drain regions 3, 4.

In such constitution of the prior art, in view of the step coverage at the edge portion or the mask slippage, usual representative values are made 0.5 to 1.0 μm for M, 0.5 to 1.0 μm for N, 0.5 to 1.0 μm for w of the opening, 0.5 to several μm for 1 and 0.5 to 0.8 μm for h.

However, in a semiconductor device having the electrode structure of the prior art as in the example as described above, even if the gate length can be made small to submicron order (0.1 μm order) by finer formation, M could be made only as small as 1 μm as the smallest. Because of the problems such as step coverage and mask slippage, when it is attempted to make M smaller than this, the yield of the semiconductor will become extremely poor.

Thus, according to the findings by the present inventors, it has been found that one of the factors which has remarkable effects for speedup of the finer semiconductor device or correspondence to large current driving for that purpose is the distance M between the above-mentioned control electrode and the main electrode, and this point should be improved and also other parasitic capacity and parasitic resistance should be reduced.

As a transistor in which only the point of M has been improved, there is a structure of SST (Super Selfalign Transistor) as shown in FIG. 12.

Here, a base electrode 1120 comprising a polysilicon doped with boron (B) and an emitter electrode comprising polysilicon doped with arsenic (As) are constituted proximate to each other. However, because the electrode is constituted of a polysilicon and the contact portion between the electrode and the base wiring 1122 must at a position apart from the base region 1114, there are technical tasks to be solved to avoid difficulty in providing an increase of base resistance and overall finer formation.

In this Figure, 1111 is a semiconductor substrate, 1112 an n+ collector embodding layer, 1113 an n− collector layer, 1114 a P base layer, 1115 a P+ base layer, 1116 an n+ emitter layer, 1117 an n+ collector layer, 1118 an n+ layer, 1119 a polysilicon collector electrode, 1120 a polysilicon base electrode, 1121 a polysilicon emitter electrode, 1122 an Al base wiring, 1123 an Al collector wiring, 1130 a field insulation film, and 1131, 1132, 1133 are insulation films.

SUMMARY OF THE INVENTION

The present invention has been accomplished in order to solve the technical task as described above, and provides an electrode for a semiconductor element which is made fine and also capable of high speed driving, and a semiconductor device having said electrode and a process for a producing the same.

Another object of the present invention is to provide an electrode for semiconductor element which can give high yield even when finely worked, and also is suitable for high speed driving and large current driving.

Still another object of the present invention is to provide a semiconductor device which can give high production yield even when highly integrated, and also is reduced in parasitic resistance and parasitic capacity between the electrodes.

Still another object of the present invention is to provide a process for preparing a semiconductor device which is suitable for providing a semiconductor device as mentioned above and is also small in preparation cost.

A constitution for accomplishing the object of the present invention is an electrode for a semiconductor element to be directly connected to the semiconductor region of a semiconductor element which is substantially shaped in a rectangular column, characterized in that, when the length of one side of the surface in contact with the semiconductor region in said electrode is defined as L, the length of the other side as W, and the length in the direction substantially perpendicular to said surface as H, said L, W, H satisfy the relationship of L>H>W.

Also, another constitution for accomplishing the object of the present invention is a semiconductor device comprising a semiconductor element formed on the major surface of a semiconductor substrate and an electrode connected through a contact hole of an insulation film provided on said major surface, characterized in that said contact hole has a substantially rectangular opening, and when the length of one side of the surface in contact with the semiconductor region in said electrode is defined as L, the length of the other side as W, and the length in the direction substantially perpendicular to said surface as H, said L, W, H satisfy the relationship of L>H>W.

Further, still another constitution for accomplishing the object of the present invention is a process for preparing a semiconductor device comprising a semiconductor element formed on the major surface of a semiconductor substrate and an electrode connected through a contact hole of an insulation film provided on said major surface, comprising the steps of forming a contact hole wherein when the length of one side of the opening in said contact hole is defined as L, the length of the other side as W, and the length, in the direction substantially perpendicular to said surface as H, said L, W, H satisfy the relationship of L>H>W; and depositing a conductor of Al or composed mainly of Al within said contact hole by CVD method utilizing at least a gas of an alkylaluminum hydride and hydrogen.

BRIEF DESCRIPTION OF THE DRAWINGS

FIG. 2 through FIG. 5 are schematic views for illustration of the preparation device suitable for preparation of the semiconductor device according to the present invention;

DETAILED DESCRIPTION OF THE PREFERRED EMBODIMENTS

Figure 1A:
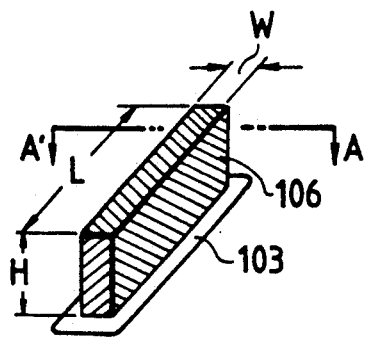
FIGS. 1A to 1E are schematic views for illustration of the structure of the electrode for semiconductor according to the present invention.
Figure 1B:
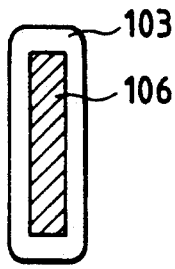
Figure 1C:
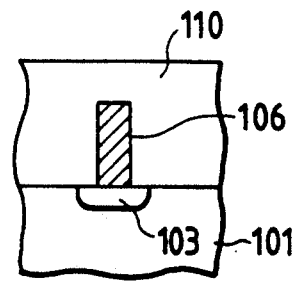

Preferred embodiments of the present invention are as described below. That is, of the conductor portions to be used for the semiconductor element, namely electrodes and wirings, particularly the portion formed in direct contact with the semiconductor region (this is called electrode for the purpose of convenience) has a substantially rectangular columnar shape, of which when the length of one side of the surface in contact with the semiconductor region in said electrode is defined as L, the length of the other side as W, and the length in the direction substantially perpendicular to said surface as H, the electrode is constituted so that the L, W, H satisfy the relationship of the following formula:

L>H>W.

FIG. 1 is a schematic view for illustration of the electrode structure as a preferable embodiment according to the present invention, (A) corresponding to its perspective view, (B) top view and (C) sectional view.

The electrode 106 has a rectangular shape in a column with a length of L, a width of W and a height of H, and is arranged in direct contact on the semiconductor region 103 provided on the major surface of the semiconductor substrate 101 and covered with an insulation film 110.

The electrode structure can improve its performance with the source-drain electrode employing the above constitution in the case a MOSFET, while particularly the base-emitter electrode, etc. taking such constitution in the case of bipolar transistor.

Particularly, it is preferably applicable to MOSFET with a gate length of 0.8 μm or less or the control electrodes (gate, base electrodes) of a bipolar transistor driven at high speed at a current density of $10^4$ A/cm$^2$ or higher, specifically $10^4$ to $10^6$ A/cm$^2$ or main electrodes (source, drain, collector, and emitter electrodes). Also, it is an electrode structure particularly suitable for a semiconductor device which is required to be driven at a high speed of 50 MHz or higher.

Thus, in the case of a FET, resistance and capacitance for main electrodes become smaller, and also the distance (M) between the main electrodes and the control electrodes becomes smaller, and therefore it is suitable for fine formation, speed-up, while in the case of bipolar transistor, the base resistance and the capacitance between base and emitter become smaller, whereby the emitter clouding effect is smaller to become suitable for fine formation, speed-up, and that effect will become further marked in high speed driving of 100 MHz or higher.

To describe in detail the electrode structure according to the present invention, it can be obtained by specifying the thickness of the insulation layer provided on the semiconductor region for making contact with the semiconductor region and the opening shape of the contact hole formed there.

More specifically, the thickness (H) of the insulation layer at the portion where the contact hole is formed is made 0.5 to 0.8 μm, the length of the longer side (L) of the contact hole opening 1 to some 10 μm and the length of the shorter side (W) 0.1 to 0.5 μm to form a contact hole which also satisfies L>H>W, and an electroconductive material constituting an electrode is formed by embedding by the sputtering method, the CVD method, etc. to form the electrode.

In the electrode structure, a barrier metal such as TiW, TiN, etc. may be interposed between that and the semiconductor region, or it may be directly contacted with the semiconductor region without use of a barrier metal.

As the deposition method of the electroconductive material in that case, tungsten (W), molybdenum (Mo), copper (Cu) may be deposited, but it is preferable use a deposition method of an electroconductive material of Al or composed mainly of Al according to the CVD method by use of an alkylaluminum hydride gas and hydrogen gas (hereinafter called Al-CVD method) as described below.

As the insulation layer, either a single layer or plurality of layers laminated may be employed, and an inorganic material such as silicon oxide, silicon nitride, etc. or an organic material such as polyimide, SOG, etc. may be employed.

Further, the shape of the contact hole may be one including a substantially square columnar shape, and even if a rectangular body may have one or more of the four corners of the opening which became rounded in the course of the process steps such as patterning, it is included within the category of the present invention.

Figure 1D:
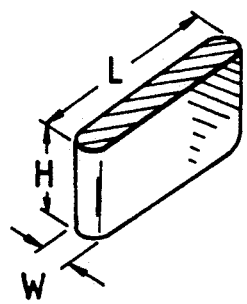
Figure 1E:
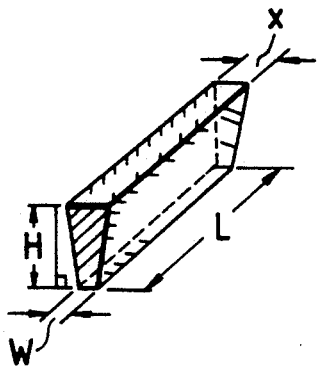

More specifically, as shown in FIGS. 1D and 1E, L, W, H may be in the relationship as specified in the present invention.

For example, a substantially rectangular body is one having the four edge portions which are rounded as shown in FIG. 1D, and also the x at the upper part slightly larger than W as shown in FIG. 1E is included.

As described above, according to the electrode structure of the present invention, the main electrode-control electrode inter-electrode distance can be made smaller as about some 100 to some 1000 Å as contrasted with that of the prior art which was said to be about 1 to several $\mu$m without lowering the yield of adjoining semiconductor devices.

Film forming method

A film forming method suitable for formation of the electrode according to the present invention is described below.

This method is a film forming method suitable for embedding an electroconductive material in the contact hole with the relationship of L>H>W for forming the electrode having the constitution as described above.

The film forming method suitable for the present invention forms selectively a deposited film through the surface reaction on an electron donative substrate by use of an alkylaluminum hydride gas and hydrogen gas (hereinafter called the Al-CVD method).

Particularly, by use of monomethylaluminum hydride (MMAH) or dimethylaluminum hydride (DMAH) as the starting gas, and $H_2$ gas as the reactive gas, the substrate surface can be heated under a gas mixture of these to deposit an Al film of good quality. Here, during Al selective deposition, it is preferable to maintain the surface temperature of the substrate at not higher than the decomposition temperature of the alkylaluminum hydride to less than 450° C. direct heating or indirect heating, more preferably 260° C. to 440° C.

As the method for heating the substrate to the above temperature range as far as possible, there are directly heating and indirect heating, but by maintaining the substrate at the above temperature by direct heating, an Al film of good quality can be formed at a high deposition speed. For example, when the substrate surface temperature is made 260° C. to 440° C. which is a more preferable temperature range, a film of good quality can be obtained at a higher deposition speed as 3000 Å to 5000 Å/min. than in the case of resistance heating. As such direct heating method (the substrate itself is heated by transmission of the energy from the heating means directly to the substrate), for example, lamp heating by halogen lamp, xenon lamp, etc. may be employed. On the other hand, as the method of indirect heating, there is resistance heating, and it can be practiced by use of a heating member, etc. provided at the substrate supporting member arranged in the space for formation of the deposited film for supporting the substrate on which the deposited film is to be formed.

By applying the CVD method to the substrate where the electron donative surface portion and non-electron donative surface portion exist according to this method, a single crystal of Al is formed under good selectivity only on the electron donative substrate surface portion. Such Al has all excellent characteristics demanded for electrode/wiring materials. More specifically, reduction of probability of hillocks generated, reduction of probability of alloy spike can be accomplished.

This may be considered to be due to the fact that Al of good quality can be selectively formed on the surface comprising a semiconductor or conductor as the electron-donative and also the Al is excellent in crystallinity, whereby there is substantially no or extremely little formation of alloy spike, etc. through eutectic reaction with silicon of the subbing layer, etc. And, when employed as the electrode for the semiconductor device, an effect surpassing the concept of Al electrode contemplated in the prior art, which could not be even predicted at all in the prior art, can be obtained.

Having described above about the fact that Al deposited within an opening with a semiconductor substrate surface exposed formed on the electron donative surface such as insulation film, it is also possible to form a metal film composed mainly of Al as described below according to the Al-CVD method, and its film quality also exhibits excellent characteristics.

For example, in addition to alkylaluminum hydride gas and hydrogen, there may be also introduced:

gases containing Si atom such as $SiH_4$, $Si_2H_6$, $Si_3H_8$, $Si(CH_3)_4$, $SiCl_4$, $SiH_2Cl_2$, $SiHCl_3$ or the like;

gases containing Ti atom such as $TiCl_4$, $TiBr_4$, $Ti(CH_3)_4$ or the like;

gases containing Cu atom such as copper bisacetylacetonate $Cu(C_5H_7O_2)_2$, copper bisdipivaloylmethanite $Cu(C_{11}H_{19}O_2)_2$, copper bishexafluoroacetylacetonate $Cu(C_5HF_6O_2)_2$ or the like; in a suitable combination to make up a gaseous mixture atmosphere to deposit selectively an electroconductive material such as Al-Si, Al-Ti, Al-C, Al-Si-Ti, Al-Si-Cu, etc., thereby forming an electrode.

The above-mentioned Al-CVD method is also a film forming method excellent in selectivity, and also the film deposited has good surface characteristics, and therefore by forming a metal film of Al or composed mainly of Al also on $SiO_2$, etc. as the Al film and insulation film selectively deposited as described above by application of the non-selective film forming method for the subsequent deposition step, a metal film suitable of high general purpose applicability as the wiring for the semiconductor device can be obtained.

Such metal film may include specifically those as mentioned below. That is, it is a combination of Al, Al-Si, Al-Ti, Al-Cu, Al-Si-Ti, Al-Si-Cu selectively selected with Al, Al-Si, Al-Ti, Al-Cu, Al-Si-Ti, Al-Si-Cu non-selectively deposited, etc.

As the film-forming method for non-selective deposition there may be included the CVD method or the sputtering method other than the Al-CVD method as described above.

Film forming apparatus

Next, a film forming apparatus suitable formation of the electrode according to the present invention is described.

Figure 3:
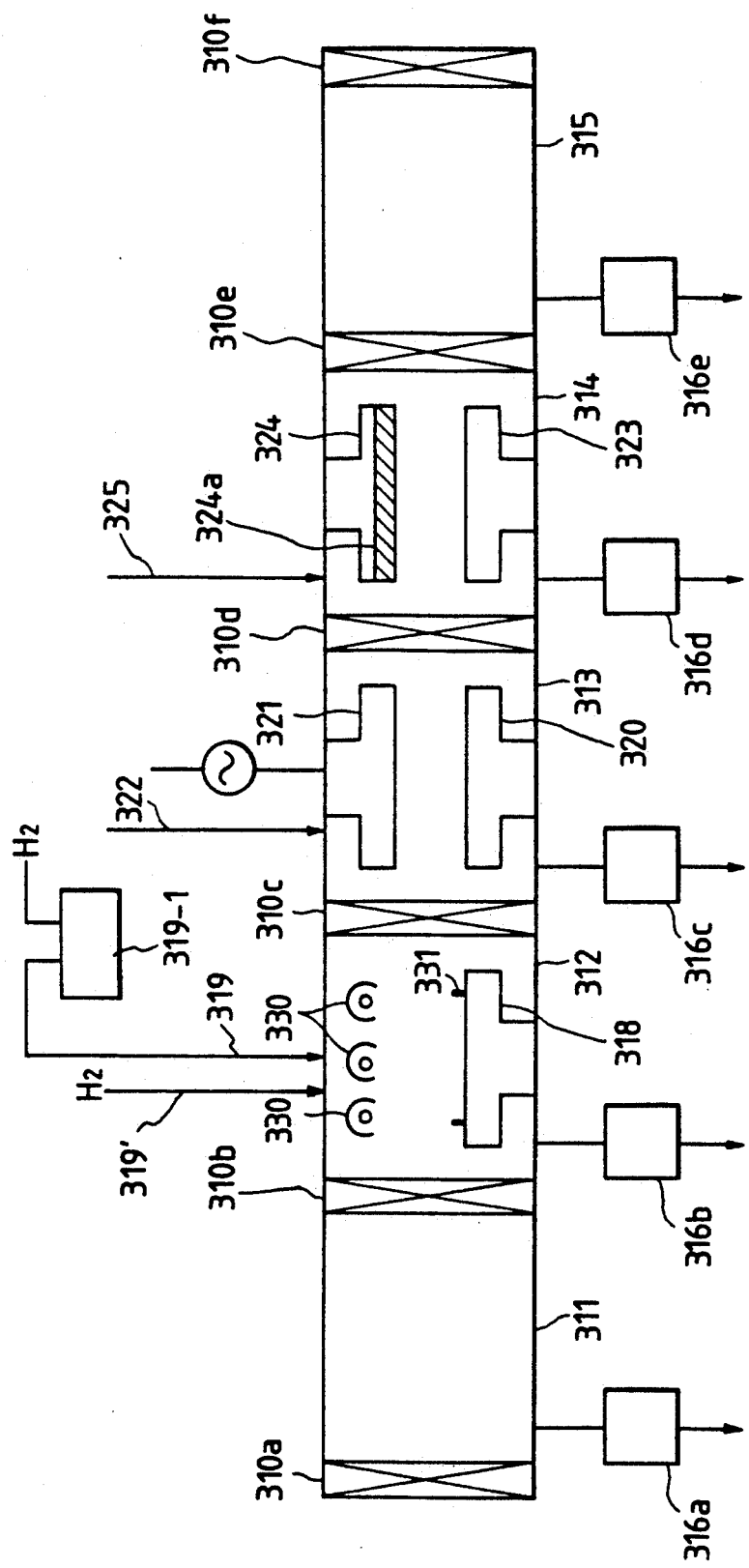
Figure 4:
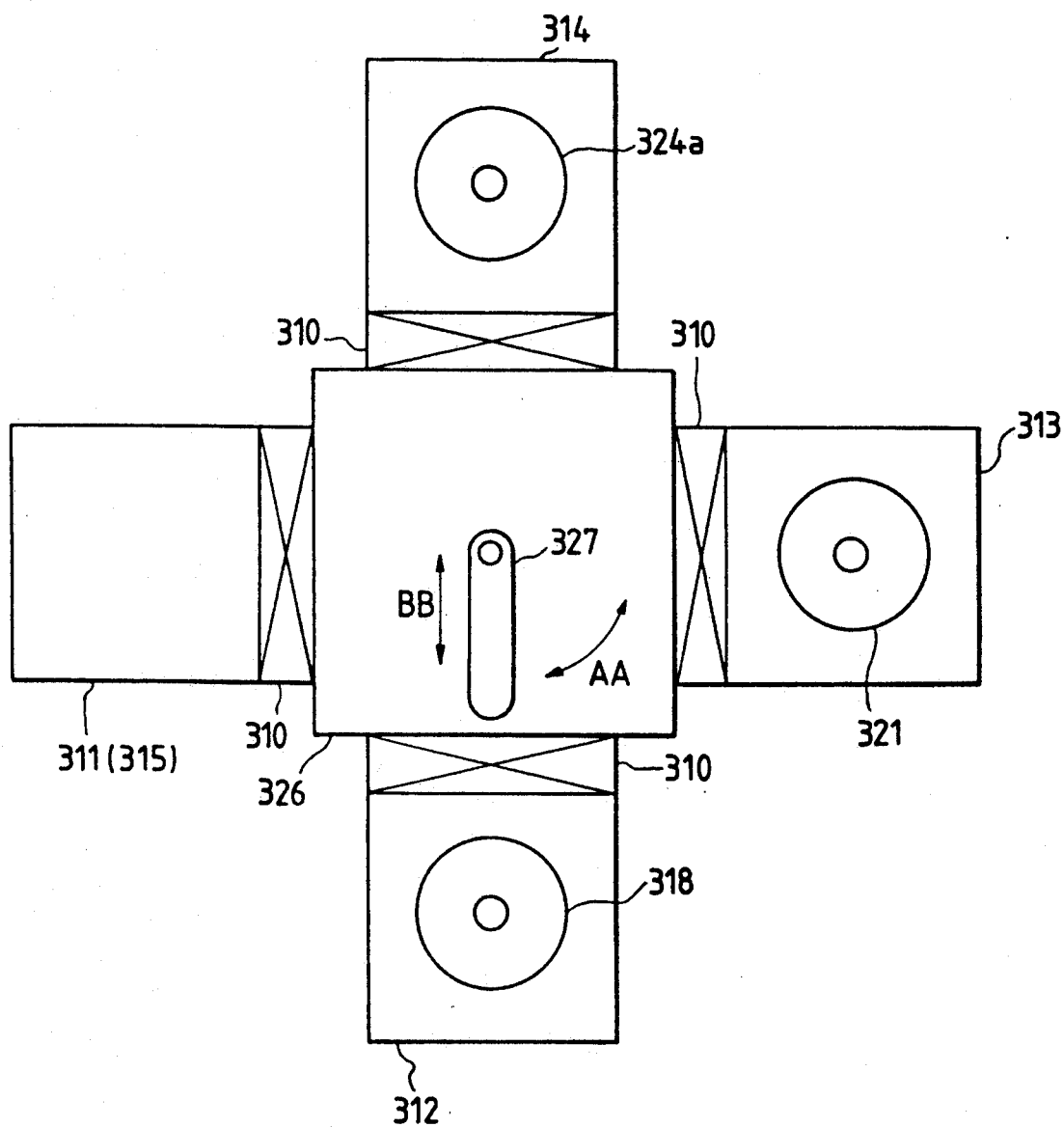

FIG. 2 to FIG. 4 show a metal film continuous forming apparatus suitable for applying the film forming method as described above.

The metal film continuous forming apparatus is constituted of the chambers connected in series communicatably mutually to one another through the gate valves 310a to 310f under shut-out of outer air, namely a load lock chamber 311, a CVD reaction chamber 312 as the first film forming chamber, an Rf etching chamber 313, a sputtering chamber 314 as the second film forming chamber and a load lock chamber 315, and the respective chambers are constituted reducible in pressure by discharging through the discharging systems 316a to 316e, respectively. Here, the above-mentioned load lock chamber 311 is a chamber for replacing the substrate atmosphere before deposition treatment with $H_2$ atmosphere after discharging in order to improve throughput characteristic. The next CVD reaction chamber 312 is a chamber to effect selective deposition on the substrate according to the above-described Al-CVD method under normal pressure or reduced pressure, which is internally provided with a substrate holder 318 having a heat-generating resistor 317 which can heat the substrate surface to form a film thereon within a range from at least 200° C. to 450° C., and is constituted so that a starting gas such as alkylaluminum hydride, etc. gasified by bubbling with hydrogen by a bubbler 319-1 through the starting gas introducing line 319 for CVD may be introduced, and also hydrogen gas as the reaction gas introduced through the gas line 319′. The next Rf etching chamber 313 is a chamber for performing cleaning (etching) of the substrate surface under an Ar atmosphere after selective deposition, which is internally provided with a substrate holder 320 heatable within a range from at least 100° C. to 250° C. and an electrode line 321 for Rf etching, and also connected to the Ar gas feeding line 322. The next sputtering chamber 314 is a chamber for depositing nonselectively a metal film by sputtering under an Ar atmosphere on the substrate surface, which is provided internally with a substrate holder 323 heated within a range from at least 200° C. to 250° C. and a target electrode 324 for mounting the sputtering target material 324a, and also connected to an Ar gas feeding line 325. The final load lock chamber 315 is a control chamber prior to ejecting the substrate after completion of deposition of metal film into outer air, and is constituted so as to replace the atmosphere with $N_2$.

FIG. 3 shows another constitutional example of a metal continuous film forming apparatus suitable for application of the film forming method as described above, and the same portions as those in FIG. 2 are shown by the same symbols. The difference of the apparatus in FIG. 3 from that in FIG. 2 is that a halogen lamp 330 is provided as the direct heating means and the substrate surface can be directly heated, and for that purpose, a nail 331 for holding the substrate under the state lifted up is arranged within the substrate holder 312.

By heating directly the substrate surface with such constitution, the deposition speed can be further improved.

Figure 5:
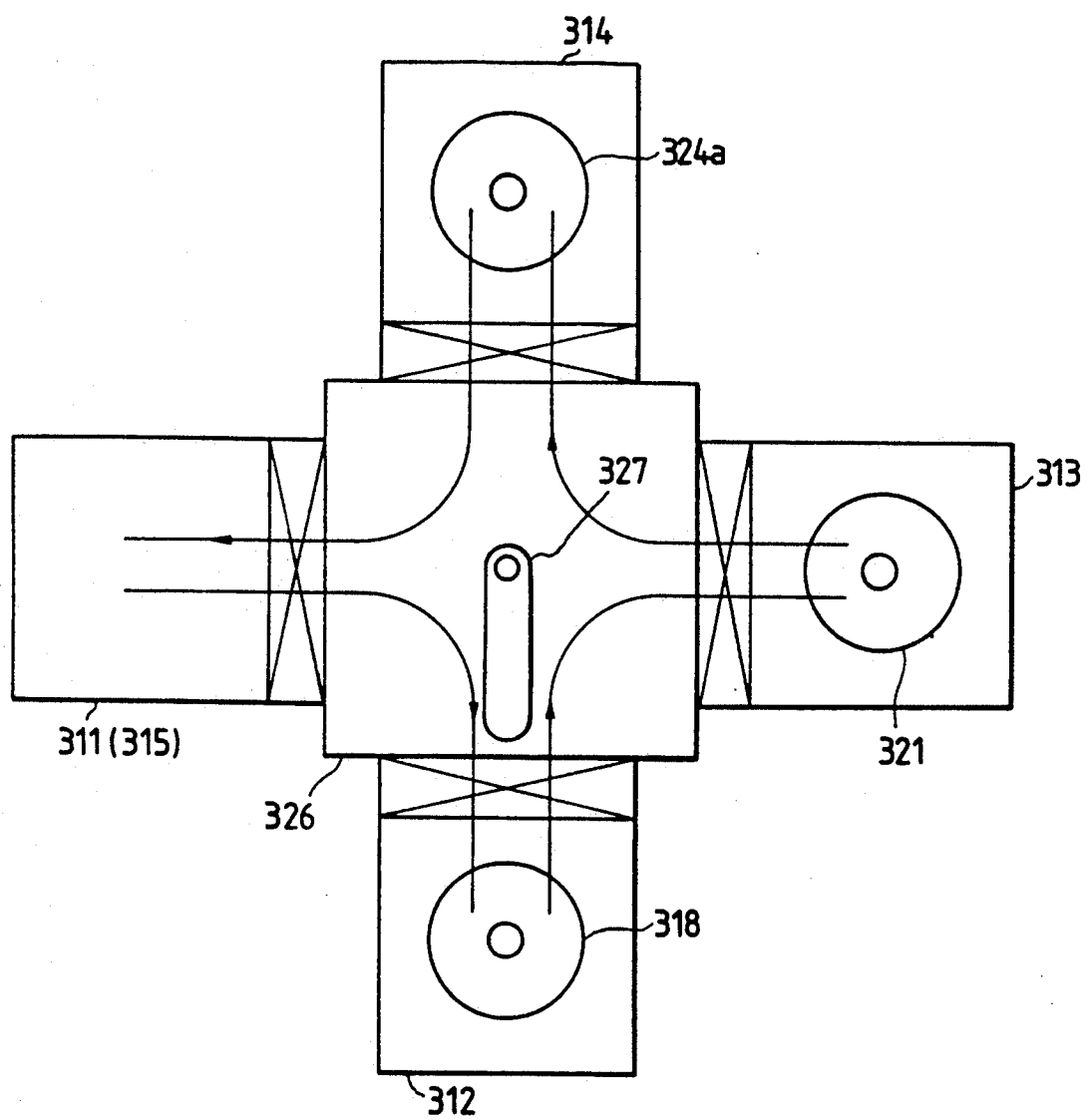

The metal film continuous metal film forming apparatus with the constitution as described above, as shown in FIG. 4, is substantially equivalent to one having the structure in which the above load lock chamber 311, CVD reaction chamber 312, the Rf etching chamber 313, the sputtering chamber 314 and the load lock chamber 315 are joined to each other through the conveying chamber 326 as the relay chamber. In this constitution, the load lock chamber 311 functions also as the load lock chamber 315. In the above conveying chamber 326, as shown in the Figure, an arm 327 as the conveying means is provided reversibly rotatable in the AA direction and stretchable in the BB direction is provided, and by the arm 327, as shown by the arrowhead in FIG. 5, the substrate can be moved continuously without exposure to outer air successively from the load lock chamber 311 to the CVD chamber 312, the Rf etching chamber 313, the sputtering chamber 314, the load lock chamber 315.

Film forming procedure

The film forming procedure for forming the electrode and wiring according to the present invention is described.

FIG. 6 is a schematic perspective view for illustration of the film forming procedure of the electrode and wiring according to the present invention.

First, the outline is described. A semiconductor substrate with an opening formed on an insulation film is prepared, and the substrate is arranged in the film forming chamber and its surface is maintained at 260° C. to 450° C. to deposit selectively Al at the portion where the semiconductor is exposed within the opening according to the hot CVD method in a mixed atmosphere of DMAH gas as alkylaluminum hydride and hydrogen gas. Of course, as described above, by introducing a gas containing Si atoms, etc., a metal film composed mainly of Al such as Al-Si, etc. may be also deposited. Next, on Al selectively deposited and the insulation film, a metal film of Al or composed mainly of Al is non-selectively deposited. Then, by subjecting the metal film nonselectively deposited to patterning to a desired wiring shape, electrodes and wiring can be formed.

Next, by referring to FIG. 3 and FIG. 6, the procedure inclusive of the remarkable effect of the Al-CVD method is described in detail.

First, a substrate is prepared, as the substrate, for example, one having an insulation film with openings of respective sizes provided on a single crystalline Si wafer is prepared.

Figure 6A:
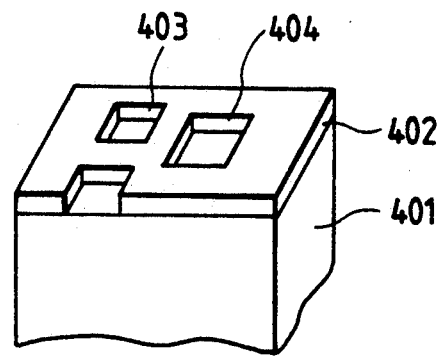
FIGS. 6A to 6D are schematic views for illustration of an electrode and a wiring forming method suitable for the process for preparing the semiconductor device according to the present invention.
Figure 6B:
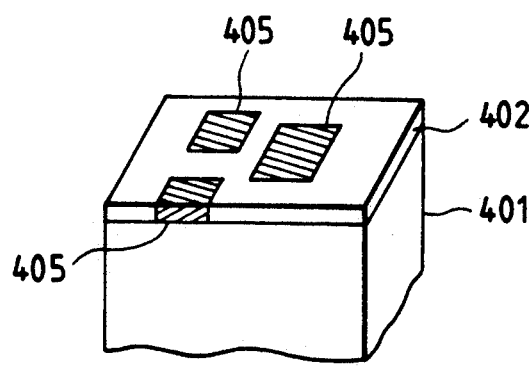

FIG. 6B is a schematic view showing a part of the substrate. Here, 401 is a single crystalline silicon substrate as the conductive substrate, 402 a thermally oxidized silicon film as the insulation film (layer). 403 and 404 are openings (exposed portions), which are different in size from each other.

The procedure for forming an Al film which becomes the electrode as the first wiring layer on the substrate is as described below by referring to FIG. 3.

The substrate as described above is arranged in the load lock chamber 311. Into the load lock chamber 311 is introduced hydrogen as described above to make it under hydrogen atmosphere. And, through the evacuation system 316b, the reaction chamber 312 is evacuated to substantially $1 \times 10^{-8}$ Torr. However, a film of Al can be formed even if the vacuum degree within the reaction chamber 312 may be worse than $1 \times 10^{-8}$ Torr.

And, the gas of DMAH subjected to bubbling from the gas line 319 is fed. For the carrier gas through the DMAH, $H_2$ is employed.

The second gas line 319' is for $H_2$ as the reaction gas, and through the second gas line 319', $H_2$ is permitted to flow, and the pressure within the reaction chamber 312 is controlled to a predetermined value by controlling the opening of the slow leak valve not shown. A typical pressure in this case may be preferably about 1.5 Torr. Through the DMAH line, DMAS is introduced into the reaction tube. The total pressure is made approximately 1.5 Torr, and the DMAH partial pressure approximately $5.0 \times 10^{-3}$ Torr. Then, the wafer is directly heated by current passage through the halogen lamp 330. Thus, Al is selectively deposited.

After elapse of a predetermined deposition time, feeding of DMAH is stopped once. The predetermined deposition time of the Al film deposited in this process means the time until the thickness of the Al film on Si (single crystalline silicon substrate 1) becomes equal to that of $SiO_2$ (thermally oxidized silicon film 2), which can be previously determined by an experiment.

The temperature of the substrate surface by direct heating at this time is made about 270° C. According to the steps up to this step, an Al film 405 is selectively deposited within the opening as shown in FIG. 6B.

The step as described above is called the first film forming step for forming the electrode.

After the first film forming step as described above, the CVD reaction chamber 312 is evacuated by the evacuation system 316b to a vacuum degree of $5 \times 10^{-3}$ Torr or lower. At the same time, the Rf etching chamber 313 is evacuated to $5 \times 10^{-6}$ Torr or lower. After confirmation that the both chambers have reached the above vacuum degrees, the gate valve 310c is opened, the substrate is moved by a conveying means from the CVD reaction chamber 312 to the Rf etching chamber 313, and the gate valve 310c is closed. The substrate is conveyed to the Rf etching chamber 313, and the Rf etching chamber 313 is evacuated until the vacuum degree reaches $10^{-6}$ Torr or lower by the evacuation system 316c. Then, argon is fed through the argon feeding line 322 for Rf etching, and the Rf etching chamber 313 is maintained in an argon atmosphere of $10^{-1}$ to 10 Torr. With the substrate holder 320 for Rf etching maintained at about 200° C., Rf power of 100 W is supplied to the electrode 321 for Rf etching for about 60 seconds to excite discharging of argon in the Rf etching chamber 313. By doing so, the surface of the substrate can be etched with argon ions to remove unnecessary surface layer of the CVD deposited film. The etching depth in this case is made about 100 Å corresponding to the oxide. Here, surface etching of the CVD deposited film was effected in the Rf etching chamber, but since the surface layer of the CVD film on the substrate conveyed through vacuum contains no oxygen in air, etc., no Rf etching may be effected. In that case, the Rf etching chamber 313, when the temperature difference between the CVD reaction chamber 312 and the sputtering chamber 314 is great, functions as the temperature changing chamber for effecting temperature change within a short time.

In the Rf etching chamber 313, after completion of Rf etching, inflow of argon is stopped and argon in the Rf etching chamber 313 is discharged. The Rf etching chamber 313 is discharged to $5 \times 10^{-6}$ Torr, and the sputtering chamber 314 is evacuated to $5 \times 10^{-6}$ Torr or loer, followed by opening of the gate valve 310d. Then, the substrate is moved by use of a conveying means from the Rf etching chamber 313 to the sputtering chamber 314 and the gate valve 310d is closed.

After the substrate is conveyed to the sputtering chamber 314, the sputtering chamber 314 is made under an argon atmosphere of $10^{-1}$ to $10^{-3}$ Torr similarly as the Rf etching chamber 313, and the temperature of the substrate holder 323 on which the substrate is placed is set to about 200° to 250° C. And, at a DC power of 5 to 10 kw, discharging of argon is effected to scrape a target material such as Al or Al-Si (Si:0.5%) with argon ions to form a film of a metal such as Al or Al-Si at a deposition speed of 10000 Å /min on the substrate. This step is a non-selective deposition step. This is called the second film forming step for formation of the wiring to be connected to the electrode.

After formation of the metal film of about 5000 Å on the substrate, inflow of argon and application of DC power are stopped. After the load lock chamber 311 is evacuated to $5 \times 10^{-3}$ Torr, the gate value 310e is opened to move the substrate. After closing of the gate valve 310e, $N_2$ gas is introduced into the load lock chamber 311 to atmospheric, and the substrate is taken out of the apparatus by opening the gate valve 310f.

Figure 6C:
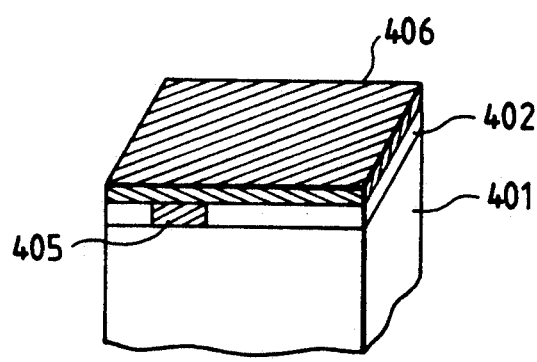

According to the second film forming step as described above, an Al film 406 can be formed on the $SiO_2$ film 402 as shown in FIG. 6C.

Figure 6D:
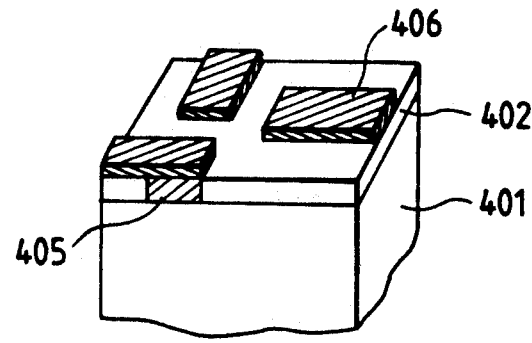

And, by subjecting the Al film 406 to patterning as shown in FIG. 6D, a wiring of a desired shape can be obtained.

In the following, description is made about that the above-described Al-CVD method is an excellent film forming method and also how the Al deposited within the opening is a film of good quality based on the experimental results.

First, as the substrate, there were prepared a plurality of substrates having $SiO_2$ of 8000 Å formed by thermal oxidation of the surface of an N type single crystalline silicon wafer and openings of various sizes from 0.25 μm × 0.25 μm to 100 μm × 100 μm patterned to have the Si single crystal of the subbing layer exposed. (Sample 1-1)

These were employed for formation of Al film according to the Al-CVD method according to the conditions described below. Under the common conditions of the starting gas of DMAH, hydrogen gas as the reaction gas, the total pressure of 1.5 Torr, the DMAH partial pressure of $5.0 \times 10^{-3}$ Torr, the power amount for current passage through the halogen lamp was controlled and film formation was conducted by direct heating at a substrate surface temperature set within the range from 200° C. to 490° C.

The results are shown in Table 1.

TABLE 1

| | Substrate surface temperature (°C.) | | | | | | | | | | | | | |
|---|---|---|---|---|---|---|---|---|---|---|---|---|---|---|
| | 200 | 230 | 250 | 260 | 270 | 280 | 300 | 350 | 400 | 440 | 450 | 460 | 470 | 480 | 490 |
| Deposition temperature (Å/min.) | ← 1000~1500 → | | | ← | | | | 3000~5000 | | | | | | → |

TABLE 1-continued

| | Substrate surface temperature (°C.) | | | | | | | | | | | | | |
|---|---|---|---|---|---|---|---|---|---|---|---|---|---|---|
| | 200 | 230 | 250 | 260 | 270 | 280 | 300 | 350 | 400 | 440 | 450 | 460 | 470 | 480 | 490 |
| Throughput (sheet/hour) | ←——— 7~10 ———→ | | | ←——————— 15~30 ———————→ | | | | | | | | | | | |
| Line defect of Si | ←——————— Not recognized ———————→ | | | | | | | | | | | | | | |
| Carbon content | ←——————— Not detected ———————→ | | | | | | | | | | | | | | |
| Resistivity | ←— 2.7~3.3 —→ | | ←——————— 2.8~3.4 ———————→ | | | | | | | | | | | | |
| Reflectance | ←——— 85~95 ———→ | | | ←——— 90~95 ———→ | | | | | | ←——— 60 ———→ | | | | | |
| Density of 1 μm or more hillocks (cm⁻²) | ←——— 1~10² ———→ | | | ←——— 0~10 ———→ | | | | | | ←——— 10~10⁴ ———→ | | | | | |
| Spike generation (%) (breaking probability of 0.15 μm junction) | ←——————— 0 ———————→ | | | | | | | | | ←——— 0~30 ———→ | | | | | |

As can be seen from Table 1, at a substrate surface temperature of 260° C. or higher by direct heating, Al was deposited selectively at a high deposition speed of 300 to 5000 Å/min. within the opening.

When the characteristics of the Al film within the opening in the range of substrate surface temperature from 260° C. to 440° C. are examined, no carbon was contained, and the characteristics were found to be good with a resistivity of 2.8 to 3.4 μΩcm, a reflectance of 90 to 95%, a density of hillocks of 1 μm or more of 0 to 10, and substantially no spike generation (breaking probability of 0.15 μm junction).

In contrast, at a substrate surface temperature of 200° C. to 250° C., the film quality was slightly inferior as compared with the case of 260° C. to 440° C. and the film obtained is considerably better as compared with those obtained in the prior art, but the deposition speed was 1000 to 1500 Å/min which can never be appreciated as sufficiently high, and the throughput was also 7 to 10 sheets/H.

When the substrate surface temperature is 450° C. or higher, the reflectance is 60% or less, the density of hillocks of 1 μm or higher 10 to $10^4$ cm$^{-2}$, the alloy spike generation 0 to 30%, whereby the characteristics of the Al film within the openings were lowered.

Next, description is made about how the method as described above can be suitably used for openings such as contact hole or thru-hole.

That is, it can be preferably applied to contact hole/thru-hole structures comprising the materials as described below.

Al films were formed on the substrate (sample) having the constitution as described below under the same conditions as in film formation of Al on Sample 1-1 as described above.

On the single crystalline silicon as the first substrate surface material a silicon oxide film was formed as the second surface material according to the CVD method, subjected to patterning according to the photolithographic steps to have the single crystalline silicone surface partially exposed.

The thermally oxidized SiO₂ film at this time had a film thickness of 8000 Å, and a size of the exposed portion of single crystalline silicon namely an opening of 0.25 μm × 0.25 μm to 100 μm × 100 μm. Thus, Sample 1-2 was prepared (hereinafter such sample is written as "CVD SiO₂ (hereinafter abbreviated as SiO₂)/single crystalline silicon).

Sample 1-3 is an oxidized film doped with boron (hereinafter abbreviated as BSG) formed by normal pressure CVD/single crystalline silicon.

Sample 1-4 is an oxidized film doped with phosphorus formed by normal pressure CVD (hereinafter called PSG)/single crystalline silicon.

Sample 1-5 is an oxidized film doped with phosphorus and boron formed by normal pressure CVD (hereinafter abbreviated as BSPG)/single crystalline silicon.

Sample 1-6 is a nitride film formed by plasma CVD (hereinafter called P-SiN)/single crystalline silicon.

Sample 1-7 is a nitride film formed by plasma CVD (hereinafter abbreviated as T-SiN)/single crystalline.

Sample 1-8 is a nitride film formed by reduced pressure CVD (hereinafter abbreviated as LP-SiN)/single crystalline silicon.

Sample 1-9 is a nitride film formed by ECR apparatus (hereinafter abbreviated as ECR-SiN)/single crystalline silicon.

Further, according to the total combinations of the substrate surface materials (18 kinds) and the second substrate surface materials (9 kinds), samples 1-11 to 1-179 (note: sample numbers 1-10, 20, 30, 40, 50, 60, 70, 80, 90, 100, 110, 120, 130, 140, 150, 160, 170 are defective). As the first substrate surface material, single crystalline silicon (single crystalline Si), polycrystalline silicon (polycrystalline Si), amorphous silicon (amorphous Si), tungsten (W), molybdenum (Mo), tantalum (Ta), tungsten silicide (WSi), titanium silicide (TiSi), aluminum (Al), aluminum silicon (Al-Si), titanium aluminum (Al-Ti), titanium nitride (Ti-N), copper (Cu), aluminium silicon copper (Al-Si-Cu), aluminum palladium (Al-Pd), titanium (Ti), molybdenum silicide (Mo-Si), tantalum silicide (Ta-Si) were employed. As the second substrate surface material, T-SiO₂, SiO₂, BSG, PSG, BPSG, P-SiN, T-SiN, LP-SiN, ECR-SiN may be employed. Also, for all of the samples as mentioned above, good Al films comparable with the sample 1-1 could be formed.

Next, on the substrate having Al selectively deposited as described above, Al was deposited nonselectively according to the sputtering method and then subjected to patterning.

As the result, of the Al film according to the sputtering method and the Al film selectively deposited within the opening, the Al film within the opening was better due to good surface characteristic, and also the contact state was high in both electrical and mechanical durability.

As described above, the Al-CVD method can form a good film which could not be accomplished according to the film forming technique of the prior art in the semiconductor production process.

First Example

In the following, the present invention is described by referring to MOSFET which one insulation gate type transistors as the semiconductor device having the electrode structure according to the present invention.

Figure 7A:
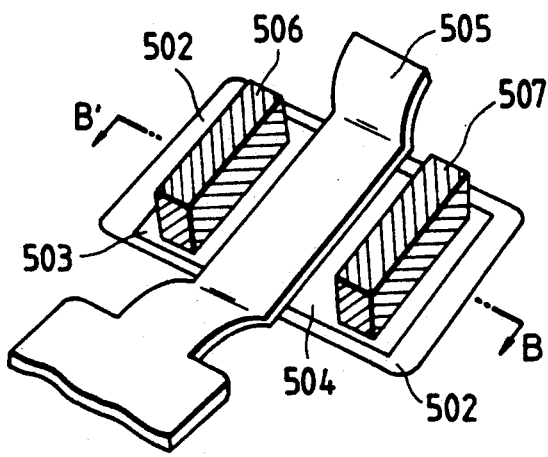
FIGS. 7A to 7C are schematic views for illustration of the semiconductor device according to the first Example of the present invention.
Figure 7B:
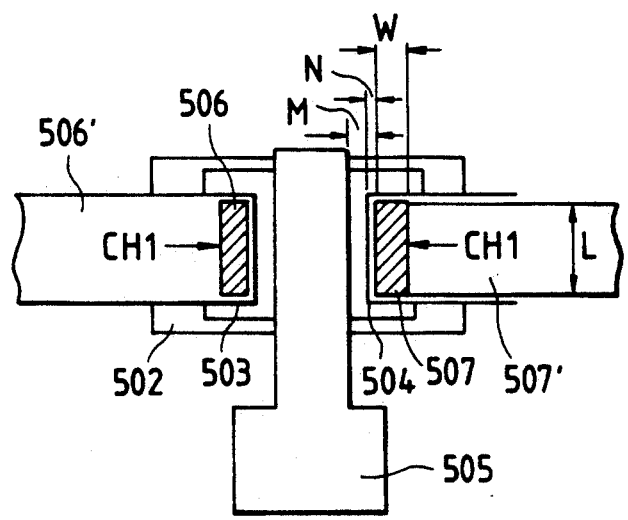
Figure 7C:
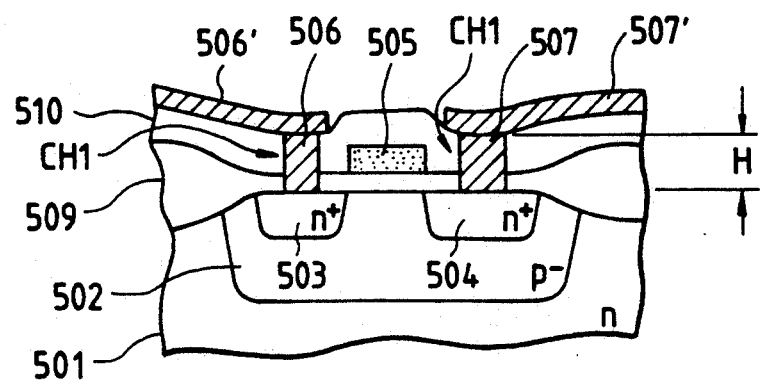

FIG. 7A is a schematic perspective view of MOSFET according to this Example, FIG. 7B its schematic top view, and FIG. 7C its schematic sectional view.

In FIGS. 7A and 7B, the insulation layer is omitted, and also in FIG. 7A, source-drain wirings 506', 507' are also omitted.

The element region enclosed within a field insulation film 509 comprising silicon oxide formed by the selective oxidation method on the major surface side of an n type single crystalline Si substrate 501, source and drain regions 503, 504 are formed within p$^-$ well 502. On the intermediate portion, namely the channel region, a gate electrode with a gate length of 0.8 $\mu$m comprising a polysilicon is arranged through a gate insulation film to form the basic structure of MOSFET.

And, on the basic structure is formed a silicon oxide film 510 as the interlayer insulation film. The layer thickness at the portion where the contact hole for the insulation film 509 and the insulation film 510 is made 0.8 $\mu$m. And, for obtaining the electrode structure according to the present invention, W of the opening of the contact hole CH1 is made by mask design 0.1 $\mu$m and L 1 $\mu$m.

Within the contact hole CH1 thus formed, source-drain electrodes 506, 507 comprising a single crystalline Al are formed according to the Al-CVD method as described above, and a source-drain wirings for insulation from these electrodes 506, 507 are formed thereon.

Thus, in this Example, the relationship of $L > H > W$ is valid.

According to this Example, the distance M between the gate electrode and the source-drain electrodes can be approached as 200 Å. The length N of the source-drain wiring 506', 507' protruded from the gate electrode side from the source-drain electrodes 506, 507 of about 10 Å, which serves to reduction of parasitic capacity.

Description of Preparation Process

Now, the process for preparing the MOSFET according to the first Example is described.

Figure 8A:
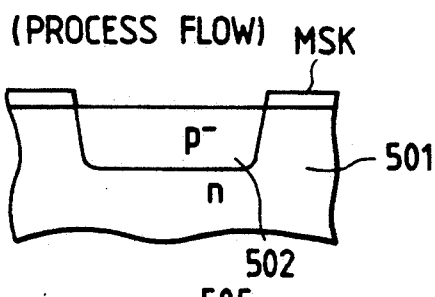
FIGS. 8A to 8F schematic sectional views showing the process for preparing the semiconductor device shown in FIG. 7.

An n type single crystalline Si substrate is prepared, and a P$^-$ type semiconductor region (P$^-$ well) 502 was formed. Here, MSK is a mask (see FIG. 8A).

Figure 8B:
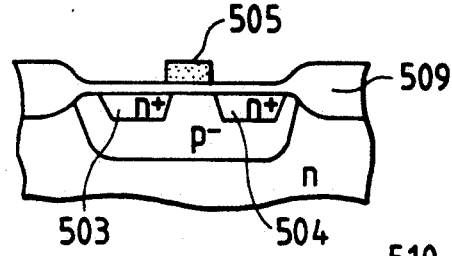

A field insulation film 509 is formed according to the selective oxidation method to sectionalize a semiconductor element forming region. Next, the polysilicon is subjected to deposition patterning to form a gate electrode 505. And, by ion injection of phosphorus, source-drain regions 503, 504 were formed by self-aligning with the gate as the mask (see FIG. 8B).

Figure 8C:
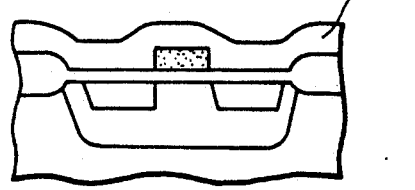

According to the normal pressure CVD method utilizing primarily O$_3$ and TEOS, a BPSG film 510 was formed as the insulation film. The total layer thickness of the insulation films on the source-drain regions 503, 504 was made 0.8 $\mu$m (see FIG. 8C).

Figure 8D:
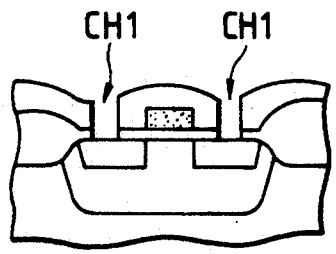

According to RIE (Reaction ion etching), a contact hole CH1 having an opened surface with W=0.1 $\mu$m, L=1 $\mu$m was formed (see FIG. 8D).

Figure 8E:
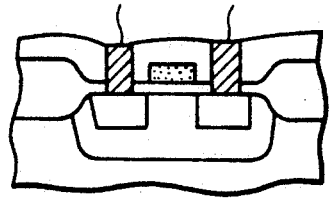

According to the Al-CVD method as described above, namely in a mixed atmosphere of DMAH as the starting gas and hydrogen as the reactive gas, while maintaining the substrate temperature at 260° to 270° C., Al was deposited selectively only within the contact hole by the hot CVD method to form rectangular electrodes 506, 507 consisted of single crystalline Al. The surface of the electrode was excellent in flatness (FIG. 8E).

Figure 8F:
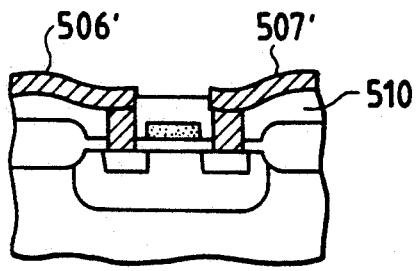

Although not shown, TiN as the subbing layer is formed to about 1000 Å on the insulation film 510 and the electrodes, 506, 507, and Al-Si-Cu was again deposited thereon by use of the Al-CVD method as described above, which then subjected to patterning to form wiring 506', 507' (see FIG. 8F).

Here, since TiN which is the subbing layer is an electron donative surface, crystalline Al could be formed according to the Al-CVD method. Here, for forming wirings 506', 507' irrespectively of whether the subbing layer is present or not, a metal film of Al or composed mainly of Al may be also formed nonselectively utilizing the sputtering method as described above.

Second Example

In the following, the present invention is described by referring to a bipolar transistor as an example of the semiconductor device having the electrode structure according to the present invention.

Figure 9A:
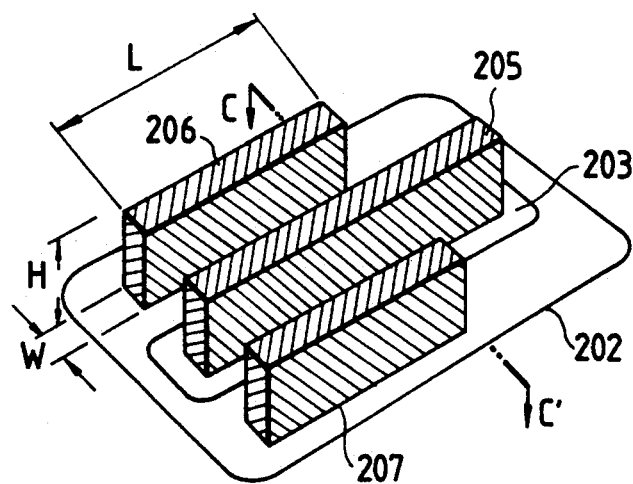
FIGS. 9A to 9C are schematic sectional views of the semiconductor device according to the second Example of the present invention.
Figure 9B:
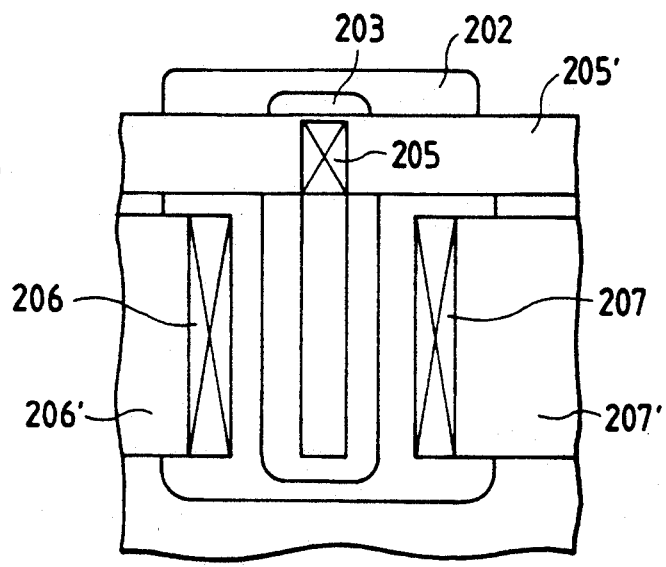
Figure 9C:
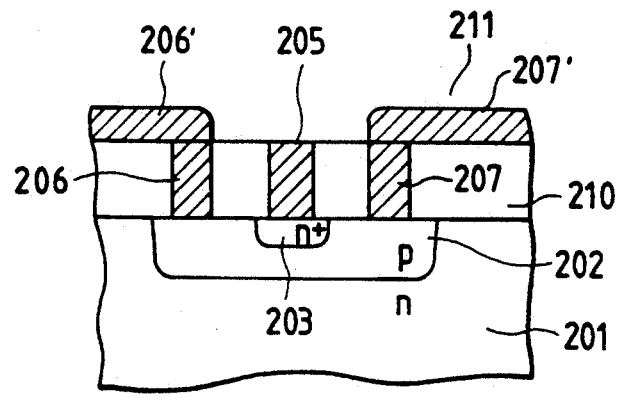

FIG. 9A is a schematic perspective view of the bipolar transistor according to this Example, FIG. 9B a schematic top view of the bipolar transistor according to this Example, FIG. 9C a schematic sectional view of the bipolar transistor according to this Example. In FIG. 9A, wirings and insulation layer are omitted.

On the major surface side of the semiconductor substrate, are formed P type base region 202, n+ type emitter region 203, and base electrodes 206, 207 comprising single crystalline Al and emitter electrode 205 comprising single crystalline Al are provided thereon.

Here, collector electrode is omitted. And, 201, 211 are insulation films. 205' is emitter wiring, and 206', 207' are base wirings. Here, the length of one of the base electrodes has a length L of 20 $\mu$m, a width W of 0.5 $\mu$m and a height H of 0.8 $\mu$m, and the same is the case with the other 207.

In the emitter electrode 205, W, H are the same as those of the base electrode, and only the length L is 22 $\mu$m, and connection to the base wiring 205' is made easier by making it longer than that of the base electrode.

The shape of such electrode is determined by specifying the length and width of the opened surface of the contact hole and its depth similarly as in the first Example.

In this Example, by employment of the above constitution, the base-emitter interelectrode distance can be made smaller to about 5000 Å, further to 100 Å. Therefore, the capacitance Cbe between base and emitter becomes smaller, whereby a bipolar transistor capable of high speed actuation can be obtained.

Description of Preparation Process

In the following, description is made about the process for preparing the bipolar transistor according to the second Example as described above.

First, on a single crystalline Si substrate, an n⁻ type collector region 201 was formed by epitaxial growth. On its major surface side was formed by ion injection a P type base region 202. Further, in that region was formed an n⁺ type emitter region 203. On the major surface of the semiconductor substrate having thus formed respective semiconductor regions thereon, a TEOS-SiO layer as the insulation layer 210 was formed, and contact holes CH2, CH3 were formed by RIE. Here, the insulation layer 210 may be also an insulation film comprising a plurality of insulation layers such as a combination of thermally oxidized $SiO_2$ and BPSG laminated. Here, CH2 is a contact hole for base electrode having a longer side (L) of 20 μm, a shorter side (W) of 0.5 μm and a depth (H) of 0.8 μm.

Figure 10A:
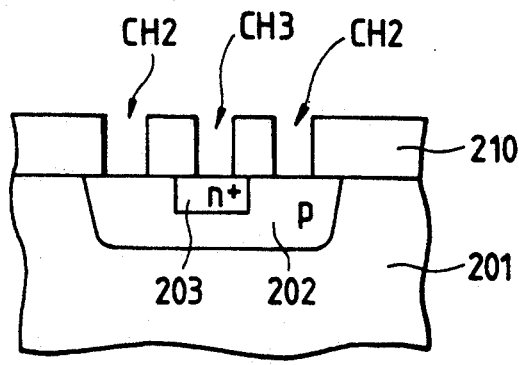
FIGS. 10A to 10C are schematic sectional views for illustration of the process for preparing the semiconductor device shown in FIG. 9.

And, CH3 is a contact hole for emitter electrode with L of 22 μm, W of 0.5 μm and H of 0.8 μm (FIG. 10A).

Figure 10B:
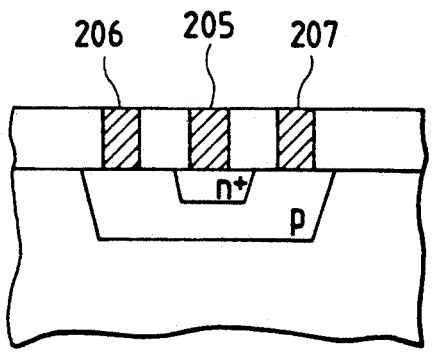

Next, according to the Al-CVD method as described above, particularly utilizing DMAH as the starting gas, hydrogen as the reactive gas, while maintaining the substrate surface at about 270° C., Al was selectively deposited within the contact hole according to the hot CVD method to form base electrodes 206, 207 and an emitter electrode 205. Here, the surfaces of the electrodes 205, 206, 207 were excellent in flatness (FIG. 10B).

Figure 10C:
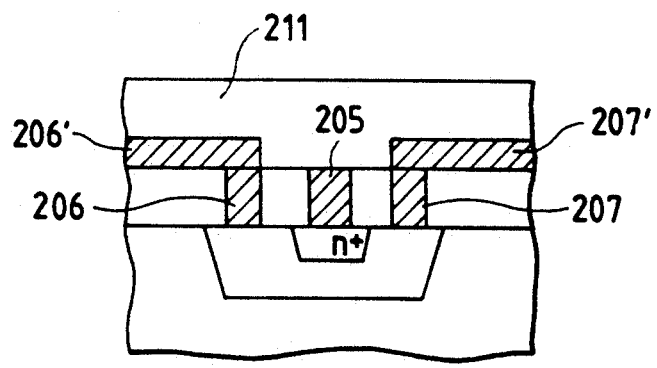
Figure 11A:
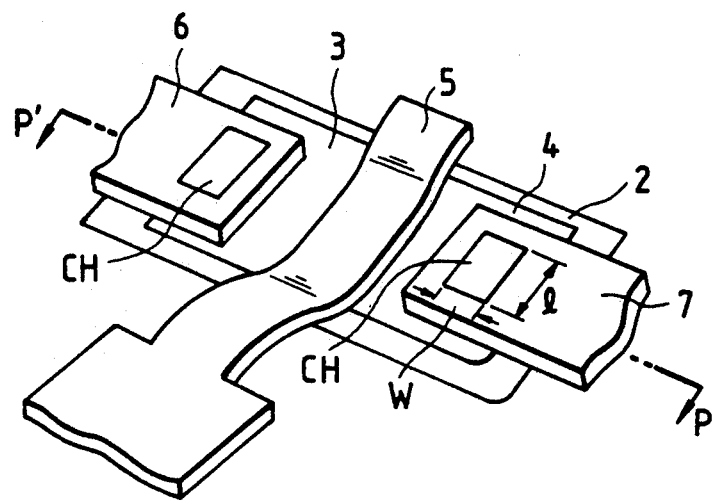
FIG. 11A to 12 are schematic sectional views for illustration of the semiconductor device of the prior art.
Figure 11B:
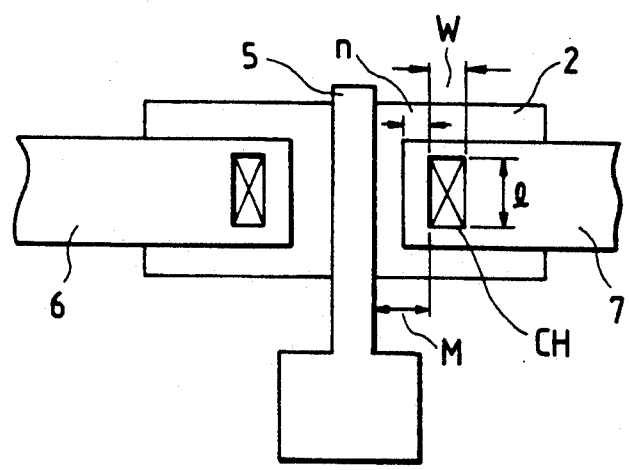
Figure 11C:
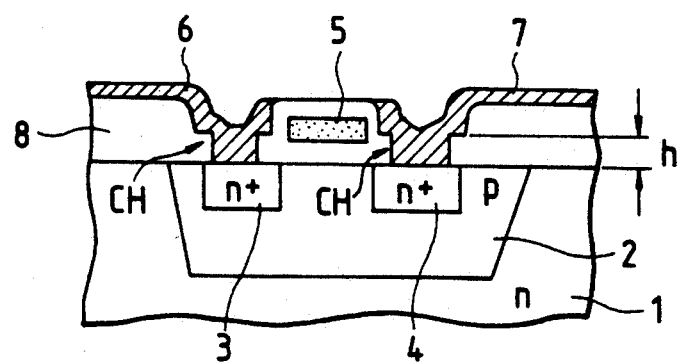
Figure 12:
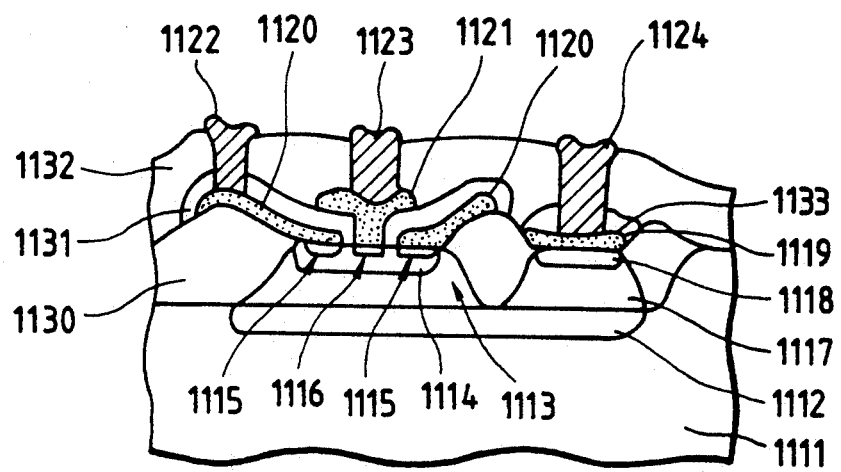

Further, although not shown, TiN film was formed to some 100 Å and subjected to patterning to a desired wiring shape. And, again on the TiN film subjected to patterning according to the Al-CVD method as described above, particularly the hot CVD method in a mixed atmosphere of DMAH, hydrogen, $SiH_4$ and bisacetylacetonate copper, Al-Si-Cu was deposited selectively to form base wirings 206′, 207′ and an emitter wiring. On these wirings was formed as the insulation layer 211 a TEOS-SiO layer (FIG. 10C).

Comparative example

A plural number of MOSFET's formed according to the preparation process as described above were prepared.

Sample 1 has a bipolar transistor formed by the prior art method, with the electrode being made l>w>h, h=0.8 μm. Sample 2 is also the same except for h>l>w, w=0.5 μm. Sample 3 is also the same except for l=h>w, w=0.5 μm. Sample 4 is also the same except for l>h=w, w=1.0 μm. Sample 5 is also the same except for l=h=w, w=0.5 μm.

In contrast, a bipolar transistor was prepared according to the same preparation process as in the second Example, and one with the electrode having l=1 μm, h=0.5 μm, w=0.1 μm is called Sample A, one with l=1 μm, h=0.8 μm and w=0.1 μm as Sample B, and one with l=1 μm, h=0.8 μm, w=0.5 μm as Sample C.

For these Samples 1 to 5 and A to C, yield, high speed performance, adaptability to large current driving were evaluated. As the result, as shown below in Table 2, Samples 1 to 5 were poor in yield because they are not suitable for fine working, and also become worsened in either of high speed performance or large current driving.

TABLE 2

| Sample No. | Yield | High speed performance | Adaptability to large current driving |
|---|---|---|---|
| A | ⊚ | ⊚ | ⊚ |
| B | ⊚ | ⊚ | ⊚ |
| C | ⊚ | ⊚ | ⊚ |
| 1 | x | x | x |
| 2 | x | x | x |
| 3 | x | x | x |
| 4 | x | x | x |
| 5 | x | x | x |

As the evaluation method, the following reliability test was conducted. First, a ring oscillator of 1001 stages comprising a plurality of the transistors of each sample was constituted, and the propagation delay time was measured. From the result, those with a yield of 90% or more were rated as ⊚, and those with above several % as x.

As to adaptability to large current driving, the experiment of flowing a current set at a current density of $10^5$ Å/$cm^2$ at the contact portion was conducted, and those without wire breaking after 1000 hours observed were rated as Å, and those with wire breaking after 500 hours observed as x.

As to high speed performance, all of samples 1 to 5 could not obtain preferable results due to the influences by parasitic capacity, parasitic resistance between the base and emitter.

Further, according to the same preparation process as in the second Example, Samples 1′ to 5′ having the same relationships as in Samples 1 to 5. However, although these were somewhat improved in yield and adaptability to large current driving, high speed performance was still insufficient.

We claim:

1. An electrode for a semiconductor element, said element having a semiconductor region thereon and said electrode being directly connected to said semiconductor region, said electrode being substantially rectangular surface in contact with said semiconductor region, said electrode further providing said element with a current flowing therethrough,
    characterized in that, when a length of said surface is defined as L, a width of said surface is defined as W and a height of said electrode perpendicular to said surface is H, said L, W and H satisfy the relationship:

L>H>W.

2. A semiconductor device comprising a semiconductor substrate having a major surface, a semiconductor element formed on said major surface, an insulation film provided on said major surface except for a contact hole through said insulation film over said element, and an electrode extending through said contact hole to contact said element, said electrode further providing said element with a current flowing therethrough,
    characterized in that said contact hole has a substantially rectangular opening over said element and said electrode contacts said element over a corresponding substantially rectangular surface such that, when a length of said rectangular surface is defined as L, a width of said rectangular surface is defined as W and a height of said electrode perpendicular to said rectangular surface is H, said L, W and H satisfy the relationship:

L>H>W.

3. An electrode for a semiconductor element according to claim 1, wherein said electrode comprises single crystalline Al.

4. An electrode for a semiconductor element according to claim 1, wherein said electrode comprises a conductor composed mainly of Al.

5. A semiconductor device according to claim 2, wherein said electrode within said contact hole comprises single crystalline Al.

6. A semiconductor device according to claim 2, wherein said electrode within said contact hole comprises a conductor composed mainly of Al.

* * * * *

UNITED STATES PATENT AND TRADEMARK OFFICE
CERTIFICATE OF CORRECTION

PATENT NO. : 5,233,224
DATED : August 3, 1993
INVENTOR(S) : OSAMU IKEDA, ET AL.

It is certified that error appears in the above-identified patent and that said Letters Patent is hereby corrected as shown below:

COLUMN 8

Line 1, "metal film" (second occurrence) should be deleted.

COLUMN 10

Line 8, "loer," should read --lower,--.

COLUMN 16

Line 27, "Å," should read --⊚,--.
Line 43, "substantially" should read --substantially shaped in a rectangular column having a substantially--.

Signed and Sealed this

Twenty-first Day of June, 1994

Attest:

BRUCE LEHMAN

*Attesting Officer*    *Commissioner of Patents and Trademarks*